(12) United States Patent
Beaudoin et al.

(10) Patent No.: US 7,656,227 B1
(45) Date of Patent: Feb. 2, 2010

(54) TECHNIQUES TO CONTROL AMPLIFIER GAIN OVER PROCESS, VOLTAGE, AND/OR TEMPERATURE (PVT) VARIATIONS

(75) Inventors: Francis Beaudoin, Brossard (CA); Matthew McAdam, Vancouver (CA)

(73) Assignee: PMC-Sierra, Inc., Santa Clara, CA (US)

( * ) Notice: Subject to any disclaimer, the term of this patent is extended or adjusted under 35 U.S.C. 154(b) by 22 days.

(21) Appl. No.: 12/037,340

(22) Filed: Feb. 26, 2008

(51) Int. Cl.
*H03F 1/14* (2006.01)

(52) U.S. Cl. ............... 330/51; 330/124 D; 330/124 R; 330/278

(58) Field of Classification Search ............ 330/51, 330/124 D, 278, 124 R
See application file for complete search history.

(56) References Cited

U.S. PATENT DOCUMENTS

| | | | |
|---|---|---|---|
| 5,166,559 A | 11/1992 | Ishihara | |
| 5,867,777 A | 2/1999 | Yamaji et al. | |
| 5,872,481 A * | 2/1999 | Sevic et al. | 330/51 |
| 5,903,854 A * | 5/1999 | Abe et al. | 455/575.1 |
| 6,288,606 B1 * | 9/2001 | Ekman et al. | 330/51 |
| 6,400,227 B1 | 6/2002 | Goldfarb et al. | |
| 6,477,358 B1 | 11/2002 | Mader et al. | |
| 6,600,369 B2 * | 7/2003 | Mitzlaff | 330/149 |
| 6,701,138 B2 | 3/2004 | Epperson et al. | |
| 6,795,694 B2 | 9/2004 | Uesugi | |
| 7,107,030 B1 | 9/2006 | Furmidge | |
| 7,113,744 B1 | 9/2006 | Moloudi et al. | |
| 7,119,621 B2 | 10/2006 | Chen et al. | |
| 7,120,411 B2 | 10/2006 | Darabi | |
| 7,120,427 B1 | 10/2006 | Adams et al. | |

* cited by examiner

*Primary Examiner*—Patricia Nguyen
(74) *Attorney, Agent, or Firm*—Knobbe Martens Olson & Bear LLP

(57) ABSTRACT

Methods and apparatus control the gain of an RF amplifier. In an example, the RF amplifier is biased for low distortion. The bias is not changed to adjust gain. Rather, the amplifier's gain is controlled by selectively activating or deactivating RF amplifier cells of the RF amplifier. This individual RF amplifier cells to be biased for good linearity and relatively good spectral performance, while permitting gain control.

16 Claims, 8 Drawing Sheets

TECHNIQUES TO CONTROL AMPLIFIER GAIN OVER PROCESS, VOLTAGE, AND/OR TEMPERATURE (PVT) VARIATIONS

BACKGROUND OF THE INVENTION

1. Field of the Invention

The invention generally relates to electronics. In particular, the invention relates to amplifier applications, such as amplifiers in RF transmitters.

2. Description of the Related Art

Amplifiers are used in a variety of electronic devices. For example, radio frequency (RF) power amplifiers prepare a signal for transmission by increasing the power of the signal. The signal, such as a television signal, radio signal, or cell phone signal, can be transmitted through the air via an antenna. Other signals, such as those found in cable-TV systems, are transmitted through wires.

Two of the main parameters describing an amplifier are its gain and its linearity (absence of distortion). In an amplifier implemented using MOS transistors, these two parameters are related to the other by the transconductance of the MOS transistor.

Three main sources of nonlinear distortion exist for MOS transistors: (1) Transconductance ($g_m$); (2) Gate capacitances ($c_{gs}$, $c_{gd}$); and (3) Junction capacitances ($c_{js}$, $c_{jd}$).

Transconductance

Distortion due to (1) transconductance will be discussed in further detail in the following. For a MOS transistor, transconductance $g_m$ is expressed in Equation 1.

$$g_m = \frac{\partial I_d}{\partial V_{gs}} \qquad \text{Eqn 1}$$

In Equation 1, $I_d$ is the drain current and $V_{gs}$ is the gate-source voltage. The transconductance $g_m$ is not a linear function of $V_{gs}$, as shown in the power series expansion of drain current expressed in Equation 2:

$$I_d = a_1 V_{gs} + a_2 V_{gs}^2 + a_3 V_{gs}^3 + \ldots \qquad \text{Eqn 2}$$

$$\text{where } a_1 = g_m,$$

$$a_2 = \frac{\partial g_m}{\partial V_{gs}},$$

$$a_3 = \frac{\partial^2 g_m}{\partial V_{gs}^2}, \text{ etc}\ldots$$

Terms $a_2$ and $a_3$ represent the second-order and third-order transconductance distortion coefficients of the MOS transistor. Second-order distortion is proportional to the first derivative of transconductance with respect to $V_{gs}$. Likewise, third-order distortion is proportional to the second derivative of transconductance with respect to $V_{gs}$.

The linear coefficient $a_1 = g_m$, typically demonstrates the trend (plotted for an arbitrarily selected sample MOS device) in FIG. 1. Second-order distortion, represented by coefficient $a_2$, is shown in FIG. 2. Third-order distortion, represented by coefficient $a_3$, is shown in the FIG. 3.

Biasing the transistor with gate-source voltage $V_{gs}$ indicated by point "A" in FIG. 3 can yield an amplifier with reduced third order distortion. Many circuits approach the issue of even-order distortion, e.g., second order, by utilizing differential topologies. Thus, the designer is left to deal with only odd order distortion, out of which, third order typically dominates.

The small-signal gain of a MOS transistor amplifier shown in FIG. 4 is expressed in Equation 3.

$$A_v = \frac{V_o}{V_i} \approx -g_m Z \qquad \text{Eqn 3}$$

In Equation 3, $g_m$ represents the transistor transconductance, and Z represents the load impedance in ohms present at the drain of the MOS transistor. Resistor R1 and voltage VB are used to set the DC current flowing in the device, setting the transistor transconductance $g_m$.

The gain of an amplifier can be adjusted by changing the load impedance and/or the transconductance of the transistor. Typically, the load impedance of an amplifier is dictated by matching requirements of the system and cannot be easily changed. One parameter that can be varied is the transconductance of the transistor. However, changing the transconductance to adjust an amplifier's gain can affect the amplifier's linearity by moving the zero-crossing point A in FIG. 3, in this case, operating in a sub-optimal region.

SUMMARY OF THE DISCLOSURE

The gain of an RF amplifier is controlled. In an example, the RF amplifier is biased for low distortion. The bias is not changed to adjust gain. Rather, the amplifier's gain is controlled by selectively activating or deactivating RF amplifier cells of the RF amplifier. This permits individual RF amplifier cells to be biased for good linearity and relatively good spectral performance, while the activation or deactivation of RF amplifier cells permits gain control.

BRIEF DESCRIPTION OF THE DRAWINGS

These drawings and the associated description herein are provided to illustrate specific embodiments of the invention and are not intended to be limiting.

DETAILED DESCRIPTION OF PREFERRED EMBODIMENTS

Figure 1:
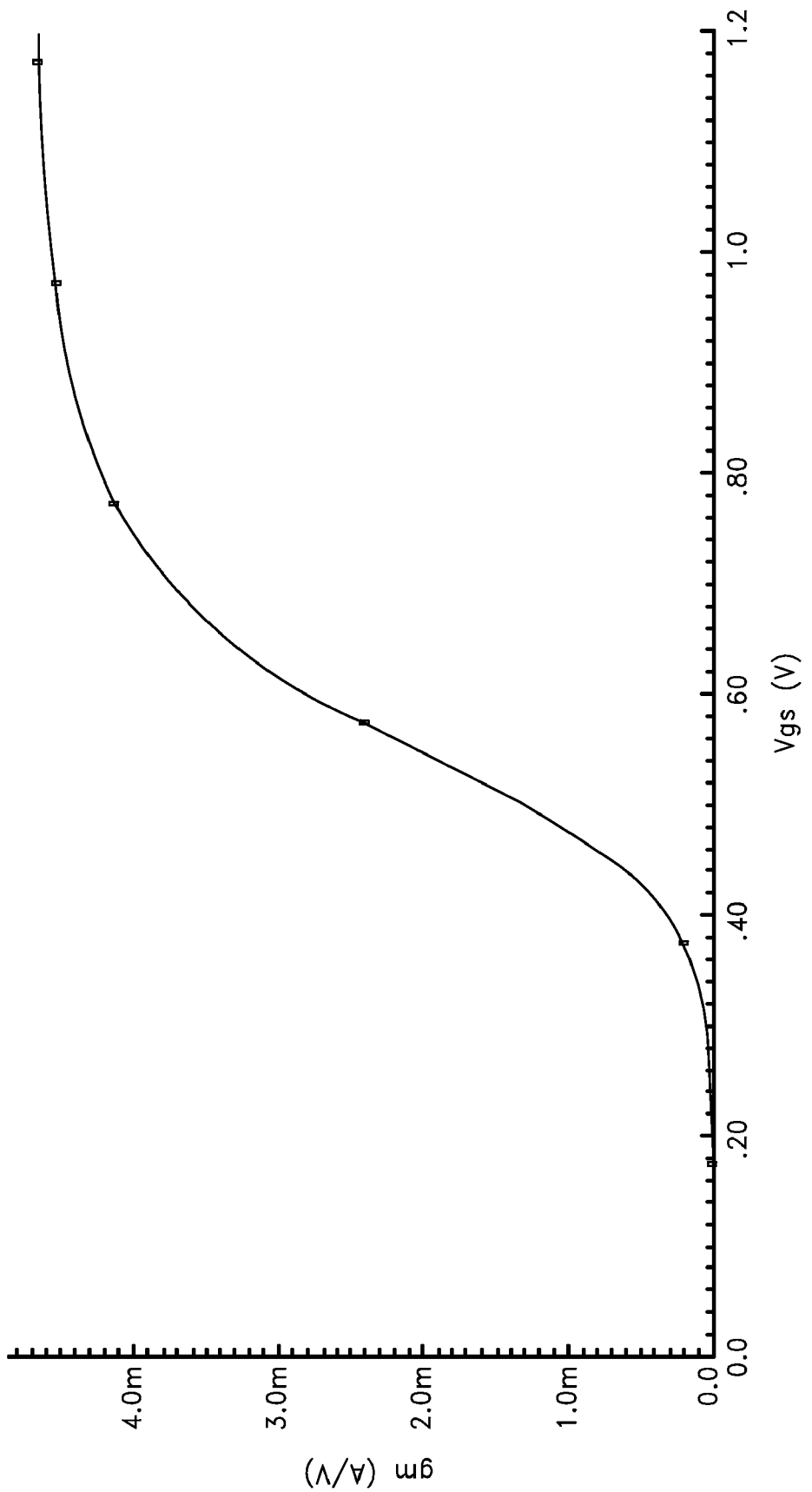
FIG. 1 illustrates an example of transconductance versus gate-source voltage.
Figure 2:
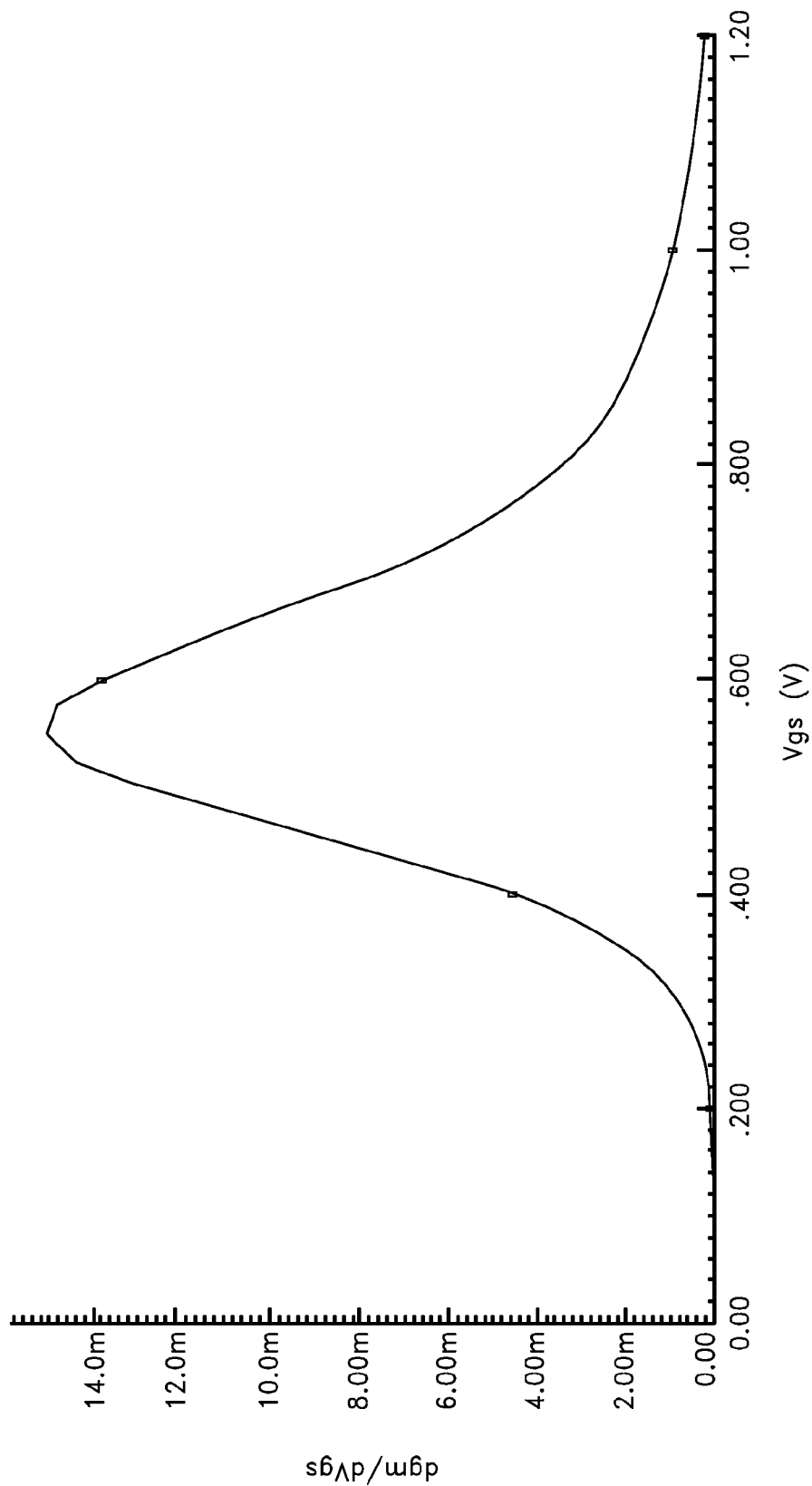
FIG. 2 illustrates an example of second-order transconductance distortion coefficient versus gate-source voltage.
Figure 3:
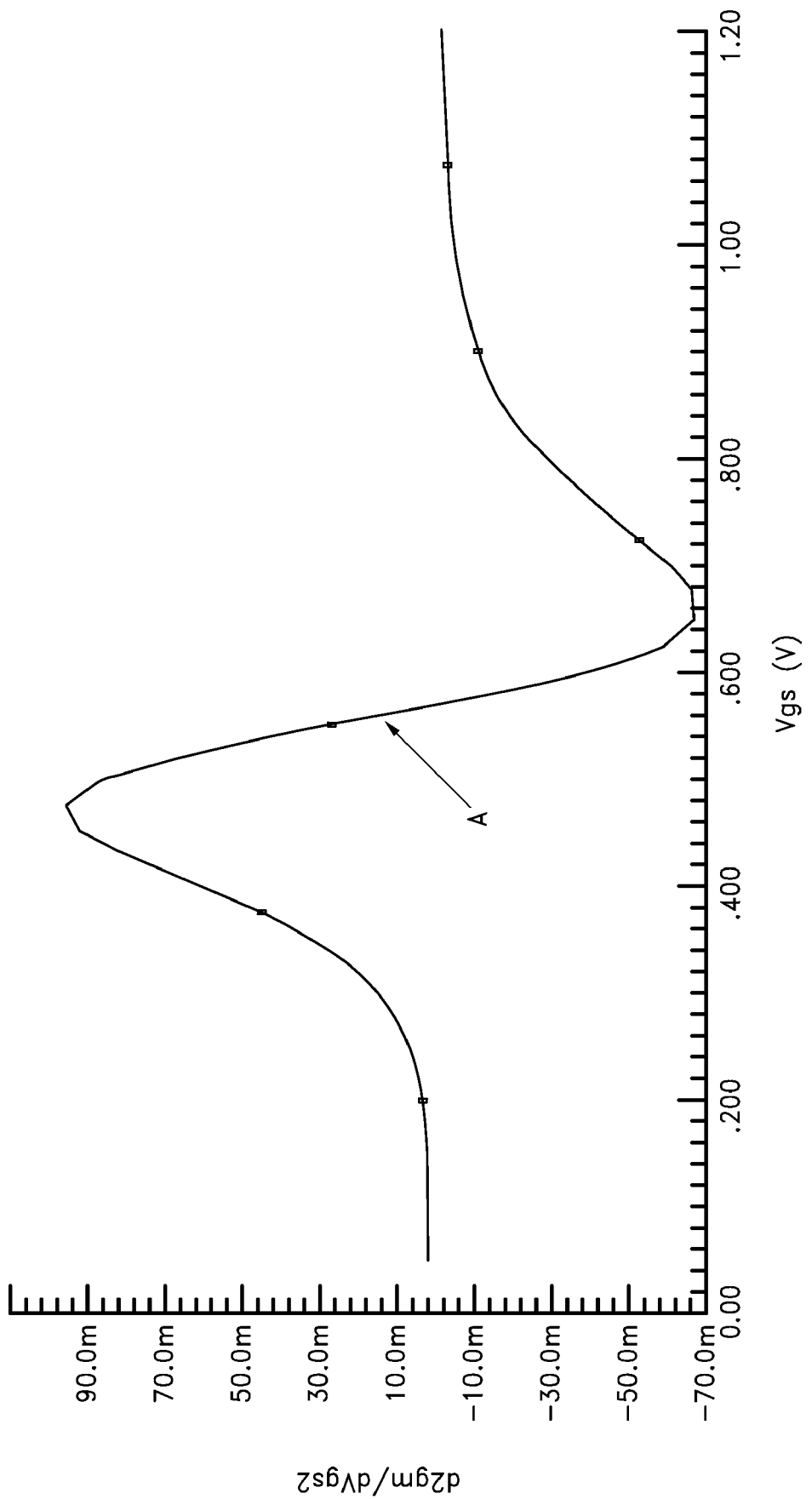
FIG. 3 illustrates an example of third-order transconductance coefficient versus gate-source voltage.

Although particular embodiments are described herein, other embodiments of the invention, including embodiments that do not provide all of the benefits and features set forth herein, will be apparent to those of ordinary skill in the art.

Most modern RF communication links require an RF amplifier to transmit power within a defined spectral mask or spectrum. Such mask is crafted to guard the transmitter against interfering with adjacent channels. Linearity specifications are also determined by in-channel distortion (error-vector magnitude). This affects the rate and reach of a link.

In the case of non-constant envelope modulation, for example, QAM-64, spectral regrowth should be tightly controlled or interference with adjacent channel is likely possible. Spectral regrowth is mainly due to the intrinsic non-linearity of the RF amplifier. The more linear the amplifier, the less spectral regrowth will occur at the amplifier's output.

RF standards, such as IEEE 802.16e, typically define a maximum power to be transmitted. For a system with a given gain uncertainty, the maximum transmitted power should be lower than the difference of the maximum allowable transmitted power and the gain uncertainty. Drawbacks are the reduced range coverage due to low transmitted power, greater dynamic range used in other portions of the circuit, and harder specifications for the amplifier.

In a typical system, the gain of the transmit chain, such as the RF amplifier, should be known during operation. In most implementations, a tradeoff is made between the RF amplifier linearity and the gain controllability, leading to an amplifier with sub-optimal linearity and added gain uncertainty. Feedback is a popular technique to achieve high linearity and controlled gain for an amplifier. However, conventional feedback is impractical at radio frequency (RF).

One embodiment addresses the problem as two distinct problems: (1) bias the RF amplifier, either by applying a gate-to-source voltage or by fixing drain current $I_D$, to provide relatively good linearity, such as, but not limited to, optimal linearity, over process, temperature, and power supply voltage variation; and (2) adjust the amplifier's gain for any temperature and power supply voltage variations, without changing the amplifier bias found previously.

One method to adjust the gain is to distribute the RF amplifier into multiple RF amplifier cells, and enabling an appropriate number of RF amplifier cells to achieve the targeted gain. An example of an RF amplifier cell that can be enabled or disabled will be described later in connection with FIG. 5.

In one embodiment, all of the secondary RF amplifier cells of the RF amplifier are biased identically from a voltage derived from a shared bias block. As will be described in greater detail later in connection with FIG. 6, the output of the main amplifier cell and the secondary RF amplifier cells are combined to form a single output for the RF amplifier.

The RF amplifier's output can be monitored by, for example, a power detector or a level detector. The detector output is converted to digital and provided as an input to a controller, such as a digital signal processor (DSP), microprocessor, microcontroller, a state-machine, or other logic. The process will be described hereafter in the context of a digital signal processor (DSP).

The determined power can be used to determine the gain of the RF amplifier. The processor compares the determined gain of the RF amplifier to a target value. The processor then adjusts the gain by enabling or disabling an appropriate number of secondary RF amplifier cells. The gain can be accurately set, even if the bias voltage varies to compensate for changes in temperature. The amplifier then operates at the desired gain while maintaining relatively good linearity.

Figure 5:
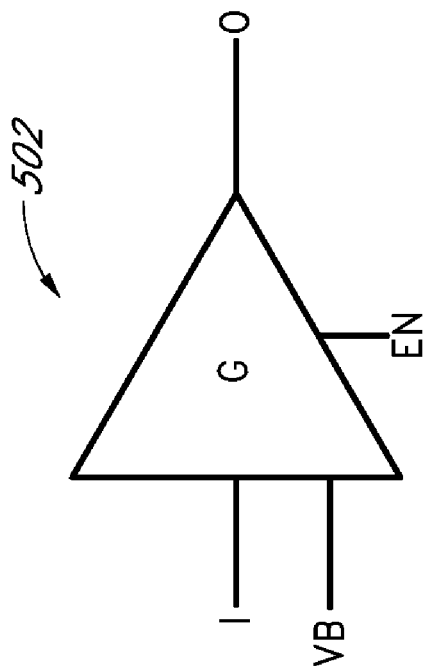
FIG. 5 illustrates an example of an RF amplifier cell with a control input for enabling/disabling the RF amplifier cell.
Figure 4:
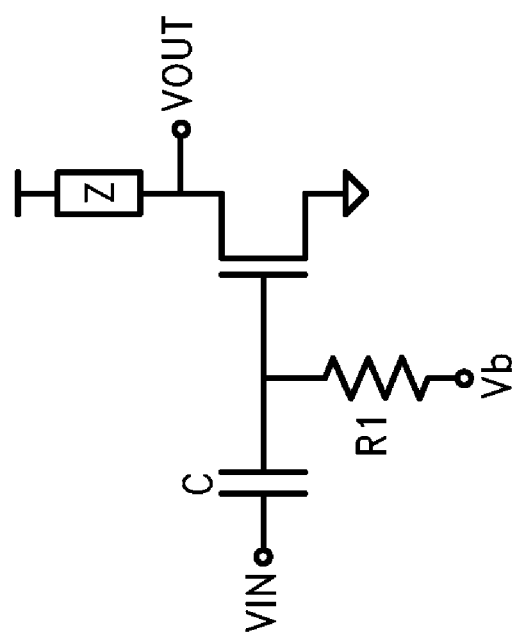
FIG. 4 illustrates an example of a MOS transistor amplifier.

FIG. 5 illustrates an example of an amplifier cell 502 with a control input for enabling/disabling the amplifier cell 502. The amplifier cell 502 includes an input terminal I, an output terminal O, a bias voltage input VB, and an enable control input EN. In FIG. 5, the amplifier cell's gain is indicated by "G." The various amplifier cells can have varying amounts of gain G.

Figure 6:
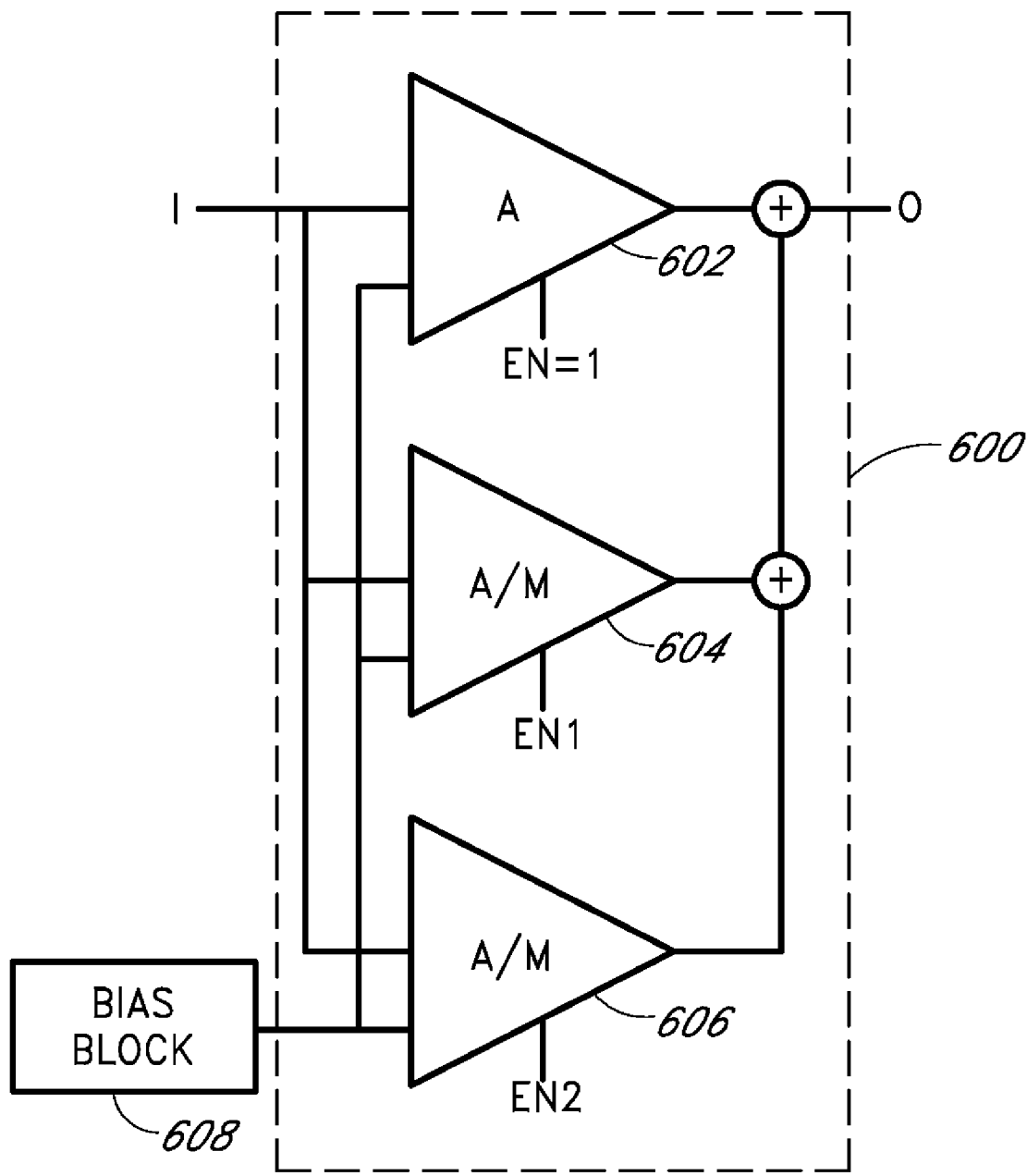
FIG. 6 illustrates an example of an amplifier system having a main RF amplifier cell and 2 secondary RF amplifier cells.

FIG. 6 illustrates an amplifier system having a main RF amplifier cell 602 and 2 secondary RF amplifier cells 604, 606. While described for the purposes of illustration with 2 secondary RF amplifier cells, the principles and advantages described herein are applicable to N secondary amplifier cells, with N covering a very broad range. In general, N can be one or more, and can vary depending on the intended application of the amplifier system.

The main RF amplifier cell 602 has a gain A, and the secondary RF amplifier cells 604, 606 each have gain A/M scaled to be smaller than the gain A of the main RF amplifier cell 602. In addition, while illustrated with the same scaling applied to both the first secondary RF amplifier cell 604 and to the second secondary RF amplifier cell 606, the scaling among two or more secondary RF amplifier cells does not have to be identical.

The illustrated secondary RF amplifier cells 604, 606 are scaled down by a factor M with respect to the main RF amplifier cell 602, while sharing the same input and output terminals. The gain of each of the illustrated secondary RF amplifier cells 604, 606 is expressed in Equation 4, where A is the main RF amplifier cell gain, and M is the scaling factor.

$$G = \frac{A}{M} \qquad \text{Eqn 4}$$

For N enabled secondary RF amplifiers, each having a gain of A/M, the overall system gain $G_T$ is expressed in Equation 5.

$$G_T = A\left(1 + \frac{N}{M}\right). \qquad \text{Eqn 5}$$

In the illustrated embodiment, each bias inputs of the amplifier cells are tied together to receive a bias voltage from a bias block 608. The inputs of the amplifier cells are also tied together, as well as the outputs of the amplifier cells to combine the output power of the cells. The "+" nodes indicates that the outputs are combined; no special circuit is needed for combination. FIG. 6 also illustrates enable control signals. The main RF amplifier cell 602 is typically always enabled when the amplifier system is in operation. The secondary RF amplifier cells 604, 606 are enabled as needed.

Figure 7:
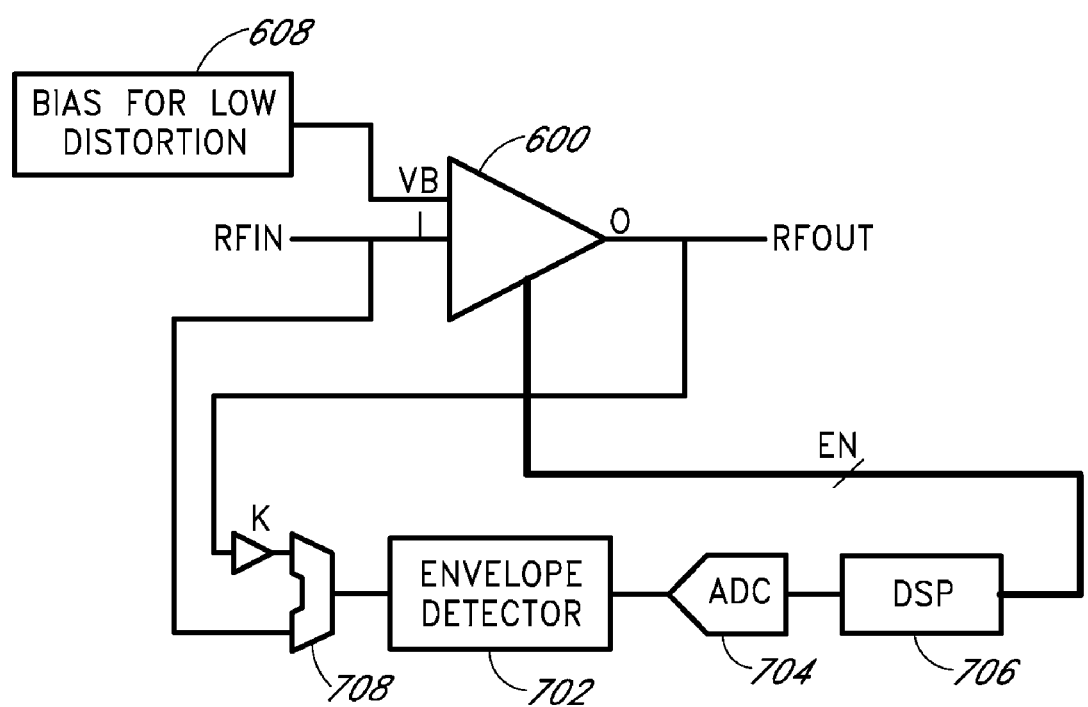
FIG. 7 illustrates an embodiment of an amplifier system with a feedback loop to select the secondary RF amplifier cells to activate to adjust gain.

FIG. 7 illustrates an embodiment of an amplifier system with a feedback loop to select the secondary RF amplifier cells to activate to adjust gain. The feedback loop calibration can be operated in two distinct ways: (a) calibrate the absolute gain of the amplifier and maintain over temperature and power supply changes; or (b) minimize the amplifier's gain variation over temperature and power supply changes. The latter method (b) is a subset of the first method (a). The latter method (b) is used in a system where the absolute RF amplifier gain does not need to be known, but where gain variations needs to be reduced to a minimum. The gain calibration implementation can be done in different ways.

The gain calibration system is built from an RF amplifier, biased from a bias block, an RF attenuator, an RF multiplexer, an RF envelope detector, an analog-to-digital converter, and a digital-signal processor or a state machine. Another implementation is to replace the RF attenuator, multiplexer, and envelope detector by two linear RF envelope detectors, one at the input of the amplifier, and a second one at its output. Gain calibration is to be performed when the system is not in transmitting mode.

One example of a calibration process that can be used with the embodiment illustrated in FIG. 7 is as follows:

(a) drive a continuous-wave (CW) signal into the RF amplifier's input;

(b) observe the RF amplifier's input signal level with an envelope detector 702, convert it to digital with the analog to digital converter (ADC) 704 and send the result to the processor, shown in FIG. 7 as a DSP 706;

(c) observe the RF amplifier's output signal level with the envelope detector 702, convert it to digital and send the result to the processor, for example, the DSP 706;

(d) the RF amplifier's intended gain is used by the attenuation factor K;

(e) if the gain is too high, decrement the gain control word and disable one or more of secondary RF amplifiers;

(f) if the gain is too low, increment the gain control word and enable one or more of secondary RF amplifiers; and (g) repeat above procedure until the gain converges to the desired value.

The attenuation K can be implemented by coupling, by an RF attenuator, or the like. A multiplexer 708 permits the envelope detector 702 to be used for both the input signal and the output signal. In one embodiment, the feedback loop adaptively adjusts the gain until the signal levels of the input match with the signal level of the output (as attenuated). It will be understood that the input signal may also be attenuated when, for example, splitting the input signal, and can easily be taken into account by one of ordinary skill in the art. It will be appreciated by the skilled practitioner that the illustrated process can be modified in a variety of ways. For example, a CW signal does not need to be used, the intended gain and the attenuation factor K do not have to match, etc. As the circuit operating temperature changes or other conditions change, for example, power supply voltage, output power, etc., the calibration process can be rerun to correct such gain variations for adaptive adjustment of gain.

Figure 8:
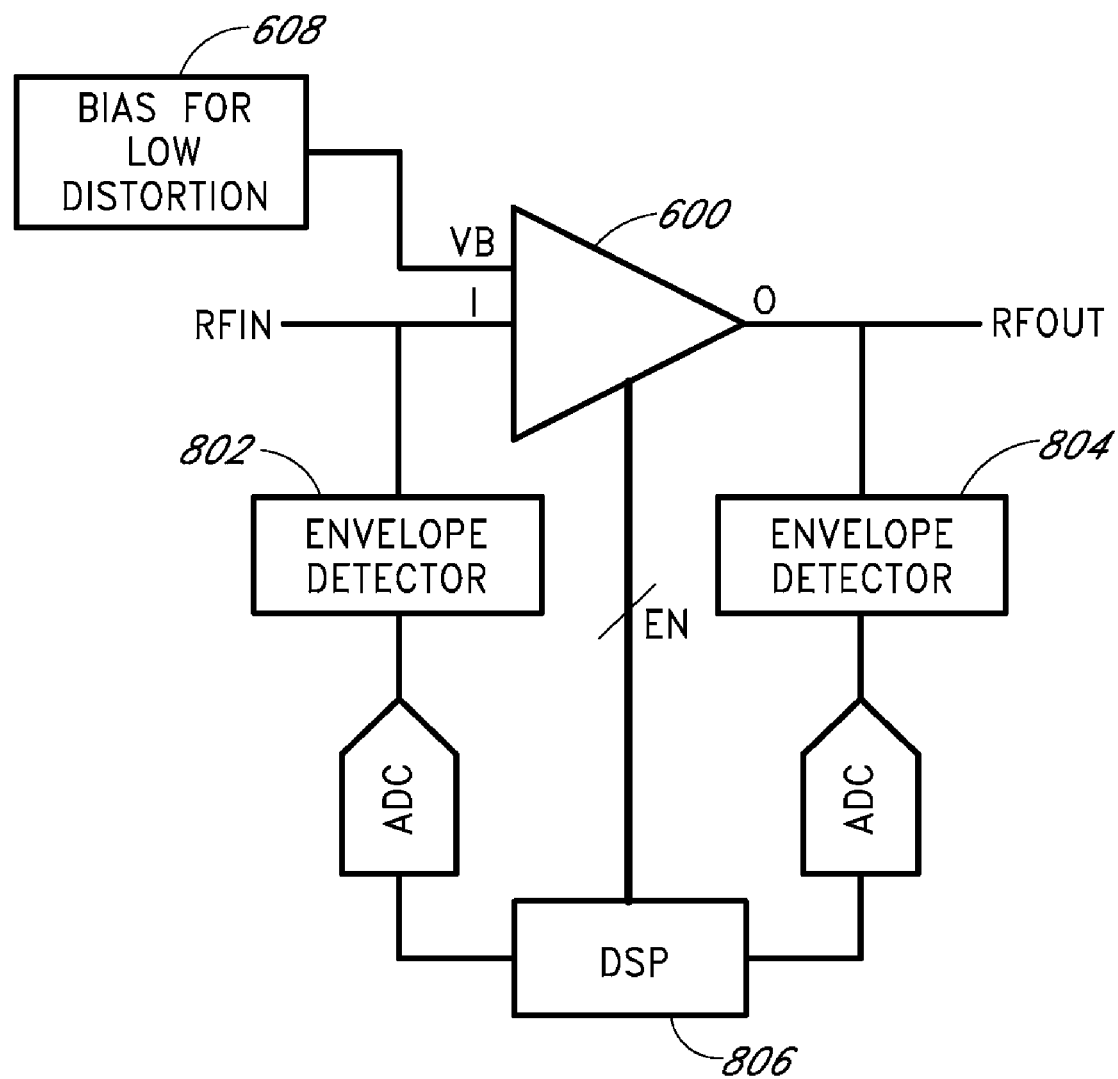
FIG. 8 illustrates an embodiment of an amplifier system with 2 envelope detectors.

FIG. 8 illustrates an embodiment of an amplifier system with 2 envelope detectors 802, 804. The gain can be determined by the processor 806 as a ratio of the output level to the input level. This implementation allows more flexibility to implement various gain levels, as the gain is not fixed by an attenuation K. The second implementation focuses more on minimizing gain variation than controlling the absolute gain of the amplifier.

Figure 9:
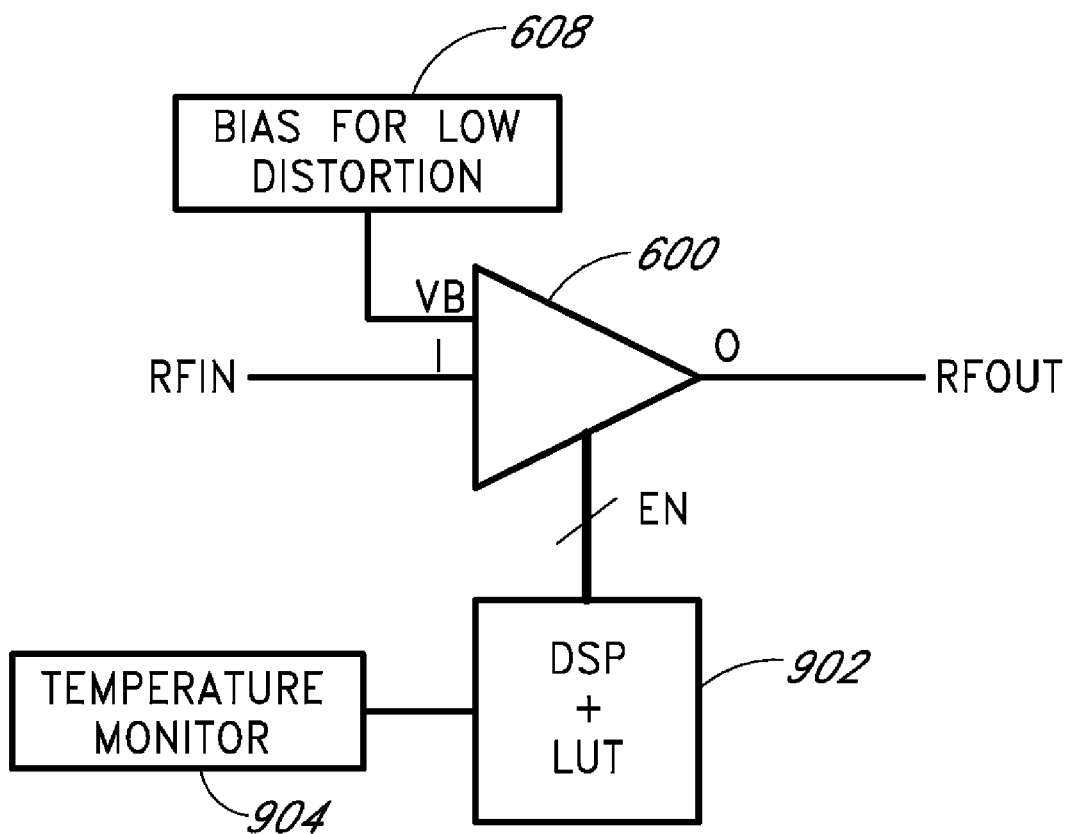
FIG. 9 illustrates an embodiment of an amplifier system with a lookup table (LUT).

FIG. 9 illustrates an embodiment of an amplifier system with a lookup table (LUT). In the illustrated embodiment, the LUT is integrated with the processor 902, illustrated as a DSP. The LUT can be stored in a memory portion or even within the executable code for the DSP. An external memory can also be used. The use of a look-up table (LUT) to adjust for gain variation is illustrated in FIG. 9.

A temperature monitor 904 provides an indication of the temperature of the circuit to the processor 902. This can be done at regular intervals or prior to a system switching from receive (RX) mode to transmit (TX) mode. If the temperature changes, the processor 902 can retrieve a corresponding gain control from the LUT, which indicates enabling or disabling selected secondary RF amplifier cells or a selected number of secondary RF amplifier cells.

The technique described in connection with FIG. 9 can be referred as an open-loop adjustment technique. One advantage over the previous feedback techniques is that the open-loop technique has relatively simple implementation. However, the temperature characteristic of the amplifier's gain should be relatively well-characterized prior to operation, either by simulation or from measurement. Then, the data for the LUT can be written to minimize gain variation.

The gain calibration can be applied to any types of amplifiers, not only RF amplifiers. Such amplifiers can be used in, for example, line drivers for digital subscriber loop (DSL) type connections, high-speed serial transmitters such as a serializer/deserializer (SerDes), or the like.

The gain calibration can be performed, not only on one amplifier only, but on many cascaded amplifiers. For example, calibration can be performed on the TX path of an RF transceiver. Such path can be composed of low-frequency baseband amplifiers and filters, followed by an RF up-converter and an RF power amplifier.

In an alternative embodiment, the envelope detection can be done with a non-constant envelope signal, for example, with the actual data while the system is in transmitting mode. The gain update can then be applied when the transmitter is turned off (receiving mode).

The temperature monitor of FIG. 9 can be replaced by a combination of a temperature monitor, a power supply monitor, and a process monitor. Additionally, the process monitor can be replaced with a value saved in the chip memory, which indicates process variation.

Control of the gain of an RF amplifier while biasing the same RF amplifier for low distortion permits cost reduction and other competitive advantages.

Advantages translate into a system with greater range (transmit distance) and/or achieving larger throughput for the same output power. While the gain uncertainty is reduced, the designer can tailor the system power/linearity budget to select cheaper components, such as, but not limited to an external power amplifier with lower linearity and gain, and still achieving targeted performances.

Various embodiments have been described above. Although described with reference to these specific embodiments, the descriptions are intended to be illustrative and are not intended to be limiting. Various modifications and applications may occur to those skilled in the art.

What is claimed is:

1. A method of controlling gain for a variable gain radio frequency (RF) amplifier, the method comprising:

combining outputs of a plurality of RF amplifier cells to generate an output for the variable gain RF amplifier, wherein the plurality of RF amplifier cells comprises a main RF amplifier cell and one or more secondary RF amplifier cells, wherein each of the one or more secondary RF amplifier cells is scaled to be smaller than the main RF amplifier cell;

biasing the plurality of RF amplifier cells for at least one of process, voltage, or temperature variation for low distortion, wherein biasing is not adaptively adjusted to vary the gain of the variable gain RF amplifier; and adaptively adjusting the gain of the variable gain RF amplifier by activating or deactivating one or more of the secondary RF amplifier cells and not the main RF amplifier cell to attain a desired gain, wherein adaptively adjusting is performed by electronic hardware.

2. The method of claim 1, wherein the main RF amplifier cell has a gain A and each of the secondary RF amplifier cells is scaled down by M from for a gain of A/M relative to the main RF amplifier cell.

3. The method of claim 1, further comprising:

generating a feedback signal from an output of the RF amplifier that is attenuated by a factor of K from the output of the RF amplifier, and adaptively adjusting the gain such that a power level of the feedback signal matches with an input power level associated with the variable gain RF amplifier such that the gain of the variable gain RF amplifier is K.

4. The method of claim 1, further comprising:
   detecting a first power level associated with an input signal for the variable gain RF amplifier;
   detecting a second power level associated with an output of the variable gain RF amplifier; and
   adjusting the gain of the variable gain RF amplifier such that second power level maintains a ratio to the first power level.

5. A method of controlling gain for a variable gain radio frequency (RF) amplifier, the method comprising:
   combining outputs of a plurality of RF amplifier cells to generate an output for the variable gain RF amplifier;
   biasing the plurality of RF amplifier cells for at least one of process, voltage, or temperature variation for low distortion; and
   adaptively adjusting the gain of the variable gain RF amplifier by activating or deactivating one or more RF amplifier cells to attain a desired gain;
   receiving an indication of a temperature of variable gain RF amplifier;
   retrieving a gain control from a pre-programmed lookup table (LUT) corresponding to the temperature indication; and
   adjusting the gain using the retrieved gain control.

6. An apparatus comprising:
   a variable gain RF amplifier comprising a plurality of RF amplifier cells combined to generate an output of the variable gain RF amplifier, wherein the plurality of RF amplifier cells comprises a main RF amplifier cell and one or more secondary RF amplifier cells, wherein each of the one or more secondary RF amplifier cells is scaled to be smaller than the main RF amplifier cell;
   a biasing circuit coupled to one or more of the plurality of RF amplifier cells for biasing, wherein the biasing circuit is configured to generate a bias for low distortion, wherein the biasing circuit is not configured to adaptively adjust the gain of the variable gain RF amplifier; and
   an adjustment circuit configured to adaptively adjust gain of the variable gain RF amplifier by activation or deactivation of one or more of the secondary RF amplifier cells and not the main RF amplifier cell to attain a desired gain.

7. The apparatus of claim 6, wherein the main RF amplifier cell has a gain A and each of the secondary RF amplifier cells is scaled down by M from for a gain of A/M relative to the main RF amplifier cell.

8. An apparatus comprising:
   a variable gain RF amplifier comprising a plurality of RF amplifier cells combined to generate an output of the variable gain RF amplifier;
   a biasing circuit coupled to one or more of the plurality of RF amplifier cells for biasing, wherein the biasing circuit is configured to generate a bias for low distortion;
   an adjustment circuit configured to adaptively adjust gain of the variable gain RF amplifier by activation or deactivation of one or more RF amplifier cells to attain a desired gain; and
   a feedback loop having a feedback signal attenuated from an output of the RF amplifier, wherein the adjustment circuit is configured to adaptively adjust the gain such that a power level of the feedback signal matches with an input power level associated with the variable gain RF amplifier such that the gain of the variable gain RF amplifier is K.

9. The apparatus of claim 6, wherein the adjustment circuit is further configured:
   to detect a first power level associated with an input signal for the variable gain RF amplifier;
   to detect a second power level associated with an output of the variable gain RF amplifier; and
   to adjust the gain of the variable gain RF amplifier such that second power level maintains a ratio to the first power level.

10. An apparatus comprising:
    a variable gain RF amplifier comprising a plurality of RF amplifier cells combined to generate an output of the variable gain RF amplifier;
    a biasing circuit coupled to one or more of the plurality of RF amplifier cells for biasing, wherein the biasing circuit is configured to generate a bias for low distortion; and
    an adjustment circuit configured to adaptively adjust gain of the variable gain RF amplifier by activation or deactivation of one or more RF amplifier cells to attain a desired gain, wherein the adjustment circuit is further configured:
    to receive an indication of a temperature of variable gain RF amplifier;
    to retrieve a gain control from a pre-programmed lookup table (LUT) corresponding to the temperature indication; and
    to adjust the gain using the retrieved gain control.

11. The apparatus of claim 6, wherein the adjustment circuit comprises a processor.

12. A computer readable medium which stores a computer program that embodies a method of controlling gain for a variable gain radio frequency (RF) amplifier, the method comprising:
    combining outputs of a plurality of RF amplifier cells to generate an output for the variable gain RF amplifier, wherein the plurality of RF amplifier cells comprises a main RF amplifier cell and one or more secondary RF amplifier cells, wherein each of the one or more secondary RF amplifier cells is scaled to be smaller than the main RF amplifier cell;
    biasing the plurality of RF amplifier cells for at least one of process, voltage, or temperature variation for low distortion, wherein biasing is not adaptively adjusted to vary the gain of the variable gain RF amplifier; and
    adaptively adjusting the gain of the variable gain RF amplifier by activating or deactivating one or more of the secondary RF amplifier cells and not the main RF amplifier cell to attain a desired gain.

13. The computer readable medium of claim 12, wherein the main RF amplifier cell has a gain A and each of the secondary RF amplifier cells is scaled down by M from for a gain of A/M relative to the main RF amplifier cell.

14. The computer readable medium of claim 12, wherein the method further comprises:
    generating a feedback signal from an output of the RF amplifier that is attenuated by a factor of K from the output of the RF amplifier, and adaptively adjusting the gain such that a power level of the feedback signal matches with an input power level associated with the variable gain RF amplifier such that the gain of the variable gain RF amplifier is K.

15. The computer readable medium of claim 12, wherein the method further comprises:

detecting a first power level associated with an input signal for the variable gain RF amplifier;

detecting a second power level associated with an output of the variable gain RF amplifier; and adjusting the gain of the variable gain RF amplifier such that second power level maintains a ratio to the first power level.

16. The-computer readable medium of claim 12, wherein the method further comprises:

receiving an indication of a temperature of variable gain RF amplifier;

retrieving a gain control from a pre-programmed lookup table (LUT) corresponding to the temperature indication; and adjusting the gain using the retrieved gain control.

\* \* \* \* \*